(12) United States Patent
Moroni et al.

(10) Patent No.: US 8,044,656 B2
(45) Date of Patent: Oct. 25, 2011

(54) DEVICE FOR CALIBRATION OF A FIELD TRANSMITTER

(75) Inventors: Andrea Moroni, Gorla Minore (IT); Alessandro Dell'Oro, Menaggio (IT); Ronaldo Dos Santos, Porlezza (IT)

(73) Assignee: ABB S.p.A., Milan (IT)

( * ) Notice: Subject to any disclaimer, the term of this patent is extended or adjusted under 35 U.S.C. 154(b) by 440 days.

(21) Appl. No.: 12/296,372

(22) PCT Filed: Mar. 19, 2007

(86) PCT No.: PCT/EP2007/052592
§ 371 (c)(1),
(2), (4) Date: Oct. 7, 2008

(87) PCT Pub. No.: WO2007/115905
PCT Pub. Date: Oct. 18, 2007

(65) Prior Publication Data
US 2010/0156396 A1 Jun. 24, 2010

(30) Foreign Application Priority Data
Apr. 11, 2006 (IT) .............................. MI2006A0716

(51) Int. Cl.
*G01R 35/00* (2006.01)
(52) U.S. Cl. ...................................................... 324/202
(58) Field of Classification Search .................. None
See application file for complete search history.

(56) References Cited

U.S. PATENT DOCUMENTS

| 4,112,272 A | 9/1978 | Jonsson et al. |
| 5,167,626 A * | 12/1992 | Casper et al. ................. 600/582 |
| 5,278,543 A | 1/1994 | Orth et al. |
| 2009/0258618 A1 * | 10/2009 | Moroni et al. ................ 455/128 |

FOREIGN PATENT DOCUMENTS

| EP | 0 597 570 | 5/1994 |
| GB | 1 261 393 | 1/1972 |
| WO | WO 2004/081501 A1 | 9/2004 |

OTHER PUBLICATIONS

European Office Action in corresponding Application No. 07 727 069.2-1242 dated Feb. 25, 2009.
Form PCT/ISA/210 (International Search Report) dated Nov. 20, 2007.
Form PCT/ISA/237 (Written Opinion of the International Searching Authority) dated Nov. 20, 2007.

* cited by examiner

*Primary Examiner* — Jermele M Hollington
(74) *Attorney, Agent, or Firm* — Buchanan Ingersoll & Rooney PC (57) ABSTRACT

Device for calibration of a field transmitter comprising a shaped body on which there are disposed first means for sensing magnetic fields the activation of which allows calibration of a first measurement parameter of the transmitter, second means for sensing magnetic fields the activation of which allows calibration of a second measurement parameter of the transmitter, magnetic actuation means suitable to activate said first and second means for sensing magnetic fields. Said shaped body is configured so that it can be removably connected to the transmitter on the external surface of the enclosure thereof.

20 Claims, 8 Drawing Sheets

DEVICE FOR CALIBRATION OF A FIELD TRANSMITTER

DESCRIPTION

The present invention relates to a device for calibration of a field transmitter having improved structure and characteristics. This application is a 371 of PCT/EP07/52592 filed on Mar. 19, 2007.

It is known, in industrial process control systems, that to sense/measure one or more physical variables of a process fluid, i.e. absolute, relative or differential pressure, flow, level and the like, specific field transmitters are widely used.

In their most common and widespread embodiment, these field transmitters comprise a suitably configured enclosure, inside which there are housed the various components for sensing, typically including: a pressure sensor to obtain easily from one or more relative, differential or absolute pressure measurements, measurement values also relating to other physical variables of the controlled process fluid which would be more difficult to transduce directly; appropriate primary electronic circuits for processing signals coming from the pressure sensor; secondary electronic circuits for processing signals coming from the primary electronic circuits and then delegated with managing communication with other transmitters or with control units; displays for on-site viewing of the sensed variables, terminal blocks for the various connections; and electrical power supply circuits of the components, etc.

In addition, these transmitters are generally provided with specific devices to perform calibration operations which during installation allow setting of a minimum value, generally zero, and a maximum value, typically the span/full scale value which define the ends of the measurement range of said transmitter.

In many industrial processes the environmental application conditions, i.e. in the presence of hazardous gases, require installed transmitters to be explosion proof; this means that any sparks, flames or hot gases generated inside the enclosure, i.e. due to a short circuit in the electrical power supply circuits, are contained therein without in any way spreading to the outside.

These applications in explosive environments clearly have an impact on calibration methods, as it is desirable for the relative devices to be configured to maintain the explosion proof characteristics of the transmitter and limit as much as possible the relative risks during calibration operations.

For this purpose, over the course of the years various solutions have been developed, in almost all cases aimed at providing calibration devices that can be operated from the outside of the transmitter enclosure so that it does not need to be opened to perform these adjustments.

At the current state of the art, although functioning efficiently, known calibration devices have some drawbacks and aspects that are not entirely efficient, in particular in relation to their constructive structure with regard to the overall number of components required, the configuration and functionality of at least some of these, and their installation and applicative use.

An example in this sense is described in the U.S. Pat. No. 5,278,543. In this case, two magnetic switches are installed in a chamber inside the enclosure of the transmitter; two blind holes are produced in the outer surface of the enclosure, in the area in which the magnetic switches are disposed; a permanent magnet with relative spring is inserted in each of the blind holes and the assembly is pressed by means of a screw; a rubber washer interposed under the head of the screw ensures that the blind hole is sealed from the outside environment. The two blind holes with relative screws are then covered by a plate attached with screws on top. In this case, to perform calibration operations the covering plate must first be removed, and then the screws inserted in the blind holes must be loosened; this allows extension of the spring and relative movement of the permanent magnet, which in this way magnetically actuates the corresponding magnetic switch inside the enclosure. The electronics associated with the two magnetic switches consequently adjust the two minimum and maximum, or zero/span values, of the transmitter. At the end of the operation, the operator must reposition all the components.

It is evident that the construction of this type of solution is complex, in view of the operations to position the various elements and the need for very low margins of tolerance, and require particularly laborious operations.

The principal aim of the present invention is to produce a device for calibration of a field transmitter, which allows the previously cited drawbacks to be overcome, and in particular, which with respect to known devices has an optimized constructive structure, both as regards installation and simplified use, and offers suitable characteristics of reliability and safety in use.

This aim is achieved by a device for calibration of a field transmitter, characterized in that it comprises a shaped body on which there are disposed first means for sensing magnetic fields the activation of which allows calibration of a first measurement parameter of the transmitter, second means for sensing magnetic fields the activation of which allows calibration of a second measurement parameter of the transmitter, magnetic actuation means suitable to activate said first and second means for sensing magnetic fields, said shaped body being configured so that it can be removably connected to the transmitter on the external surface of the enclosure thereof.

Further characteristics and advantages of the invention will be more apparent from the description of preferred but not exclusive embodiments of the device according to the invention, illustrated by way of a non-limiting example in the accompanying drawings, wherein.

Figure 1:
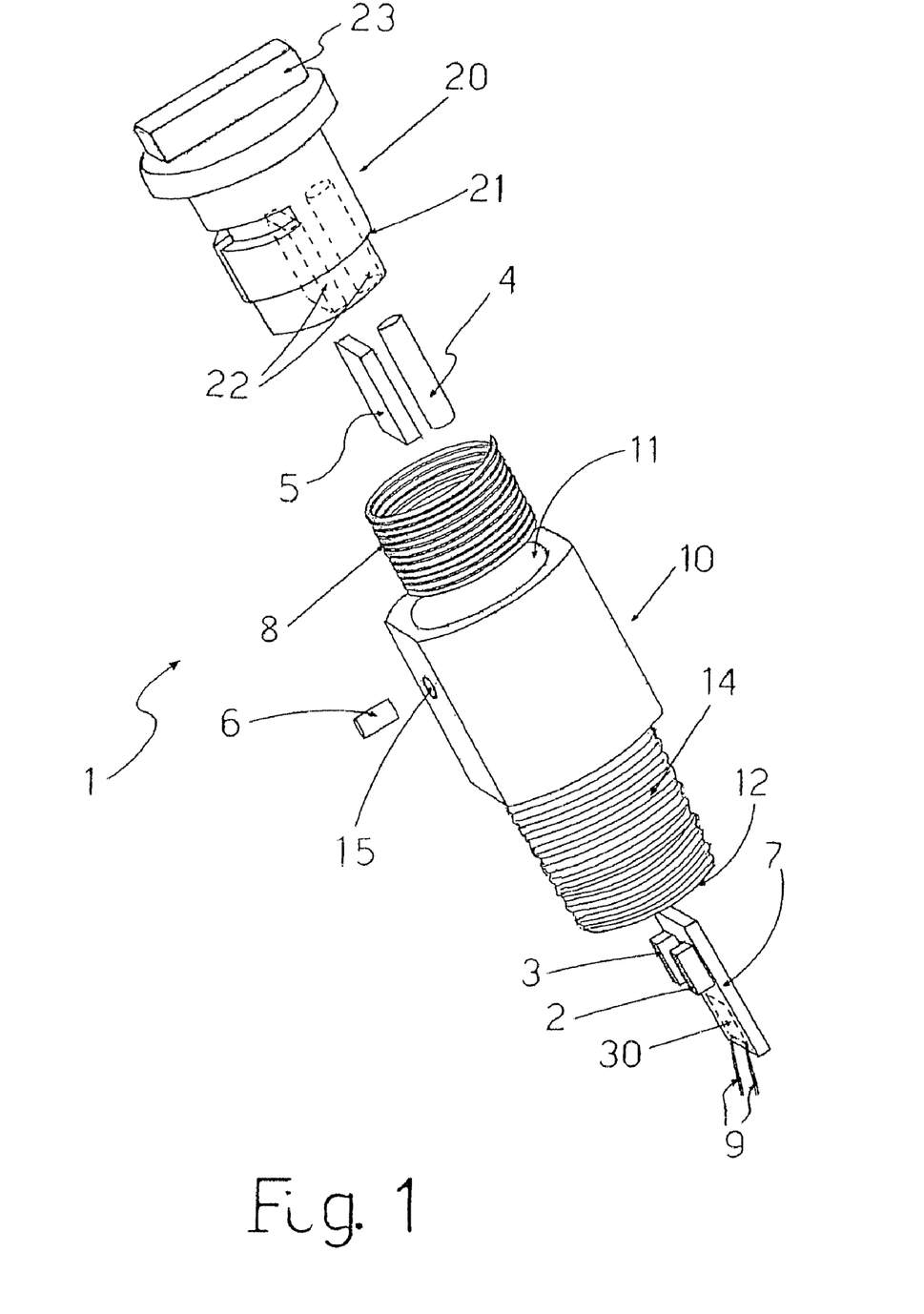
FIG. 1 is a perspective exploded view illustrating a possible embodiment of the device according to the invention.
Figure 7:
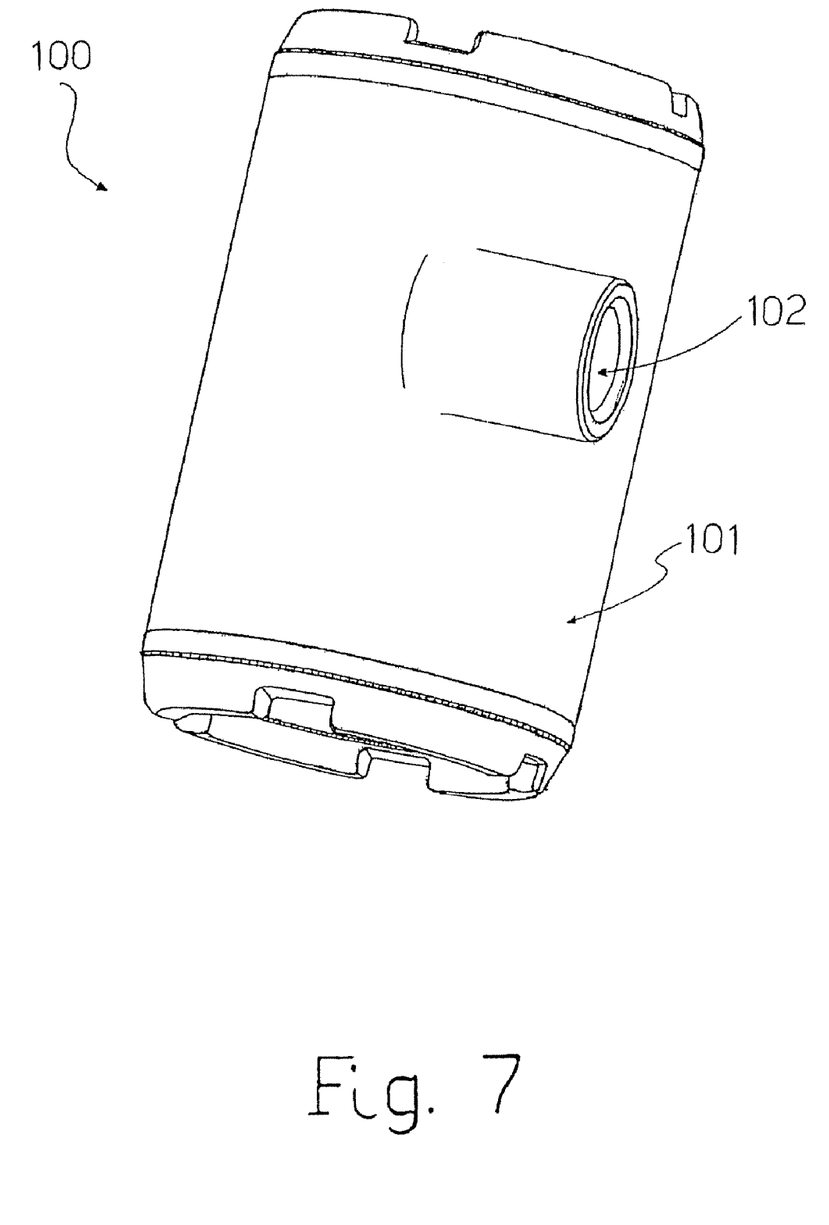
FIG. 7 is a perspective view of a field transmitter using a calibration device according to the invention.

FIG. 1 is an exploded view of a possible embodiment of a device according to the invention for calibration of a field transmitter; these transmitters are industrial devices suitable to sense/measure a physical variable of a process fluid, i.e. pressure. An example of a field transmitter, in particular a pressure transmitter, is represented in FIG. 7 with the reference number 100, which, according to widely known embodiments and for this reason not illustrated in detail, comprises an enclosure 101 housed inside which there are various components, generally including a sensor, such as a pressure sensor, electronic processing means that are operatively associated with the sensor and process the signals sensed thereby, a terminal block for the various internal and external connections to the transmitter, etc.

In the embodiment illustrated in FIG. 1, the device for calibration of a field transmitter 100 of the type mentioned above comprises a shaped body 1 configured so that it can be removably connected to the transmitter 100 on the external surface of the enclosure 101, according to the methods to be described below; in particular, directly on the shaped body 1 there are disposed first means for sensing magnetic fields 2 the activation of which allows calibration of a first measurement parameter of the transmitter, such as the zero of the transmitter, and second means for sensing magnetic fields 3 the activation of which allows calibration of a second measurement parameter of the transmitter, such as the span/full scale value. Also disposed on the body 1 are magnetic actuating means suitable to activate the first 2 and/or second 3 means for sensing magnetic fields, as will be apparent from the description below.

Figure 6:
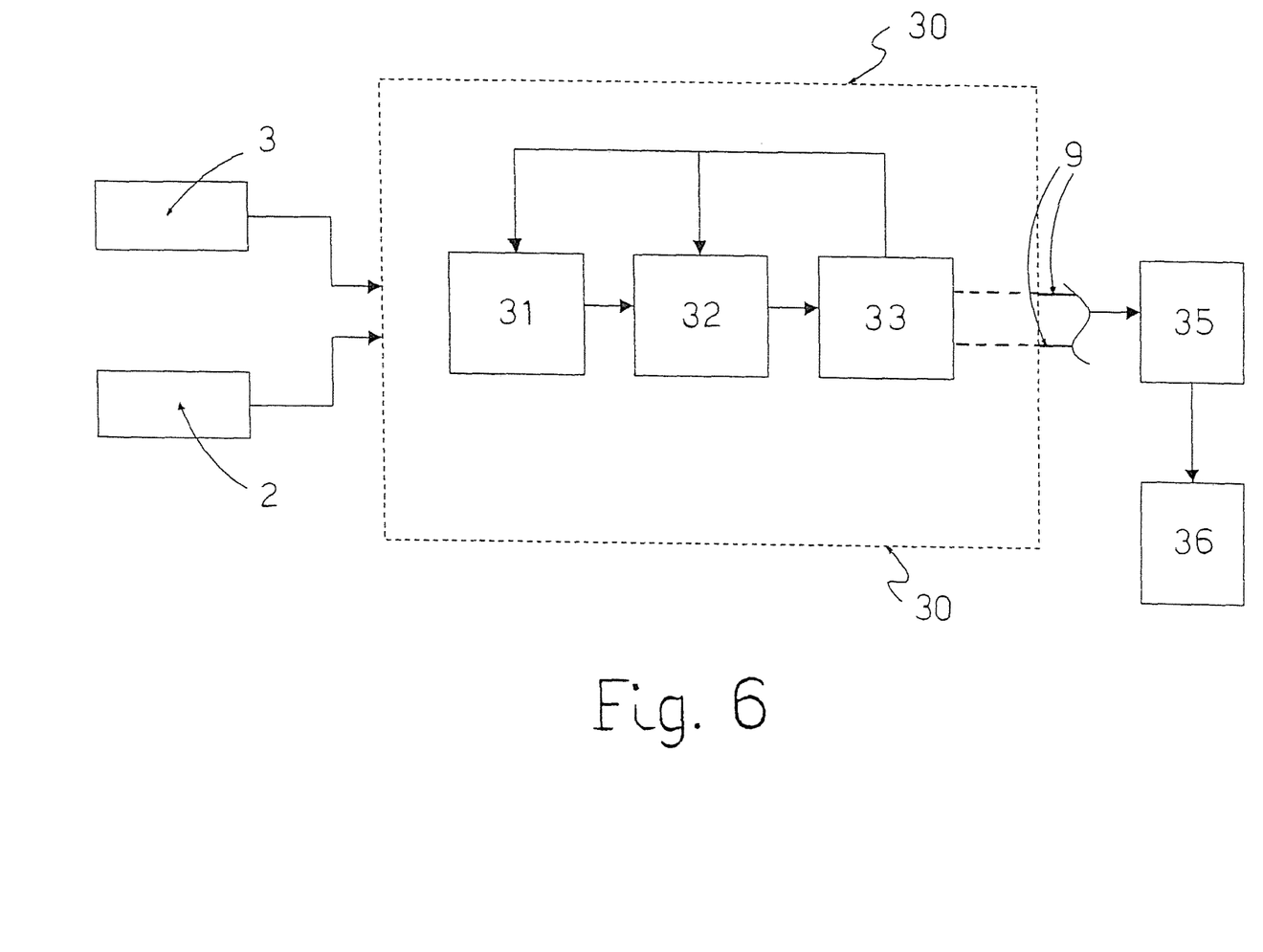
FIG. 6 is a block diagram of an electronic processing circuit used in the device according to the invention.
Figure 8:
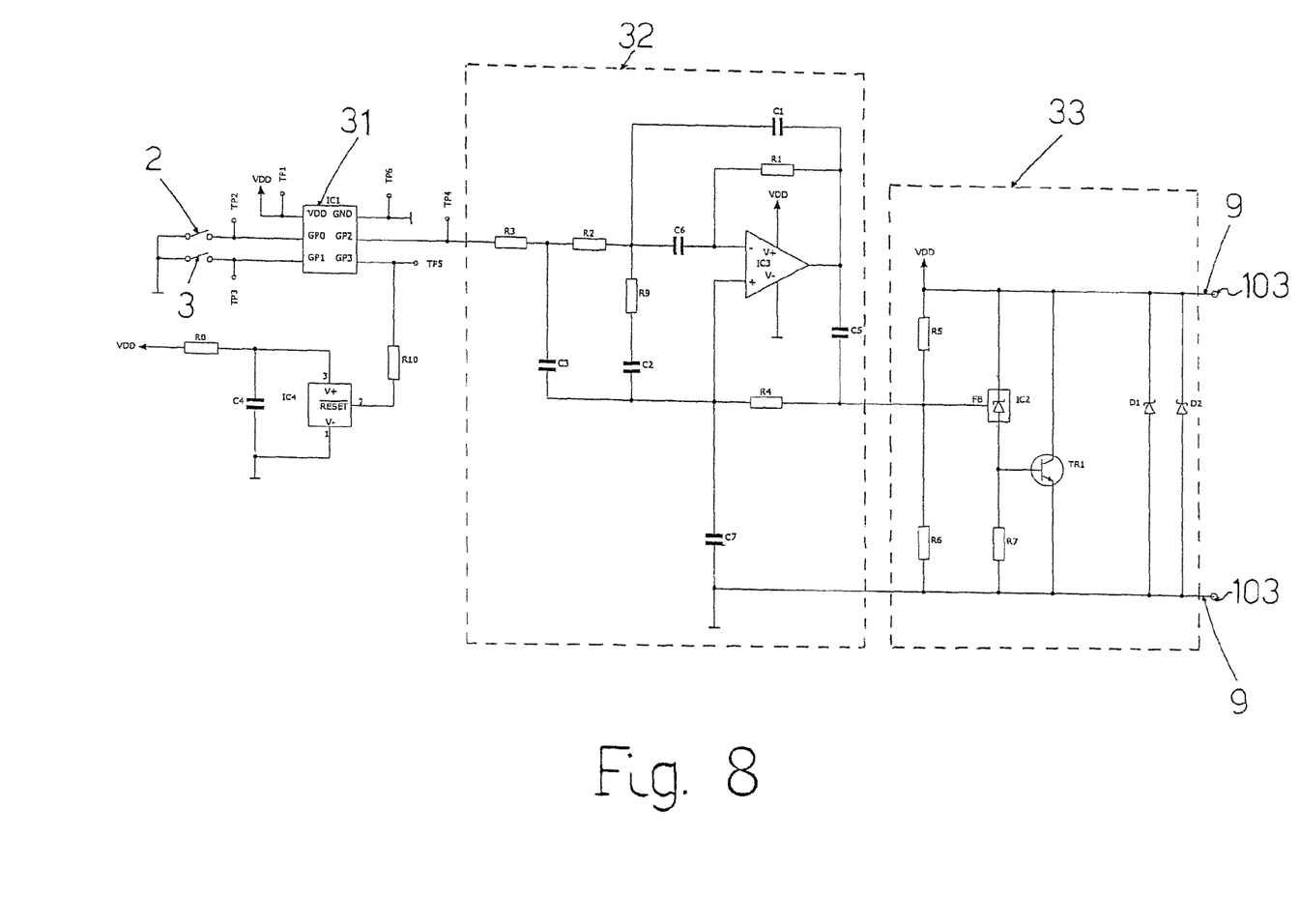
FIG. 8 is a circuit diagram illustrating a possible embodiment of the electronic circuit in FIG. 6.

Advantageously, on the shaped body 1 there is also disposed an electronic circuit 30, of which FIGS. 6 and 8 respectively show a block diagram and a possible embodiment (R1, R2, etc. indicate resistors, C indicates capacitors, D indicates diodes, and so forth); said circuit 30 is operatively connected to the first and second magnetic means 2 and 3 and is designed to be operatively connected, during installation, to the electronic processing means of the transmitter 100.

According to a preferred embodiment, the shaped body 1 comprises two principal component parts of which: a first component 10 to which the first and the second means for sensing magnetic activation fields 2 and 3 are operatively connected, which is suitable to be removably connected to the enclosure 101 of the transmitter 100; and a second component 20 to which the magnetic actuation means are operatively connected, which is connected to the first component 10 movably in relation thereto; preferably, the second component 20 is coupled to the first component 10 rotatably in relation thereto.

Advantageously, the two components 10 and 20 are coupled relatively movably to each other so that, in operating conditions, the magnetic actuation means are positionable in a neutral non-activating position of the first and of the second magnetic means 2 and 3, or in activating position/positions thereof; in particular, the magnetic actuation means are housed on the body of the second component 20 and are configured to take, following movement of the second component 20 with respect to the first component 10, besides the neutral non-activating position, a first position for activating only the first means for sensing magnetic fields 2, or alternatively, a second position for activating the second means for sensing magnetic fields 3. In the embodiment illustrated in FIGS. 1-5, the first component 10 comprises a first hollow portion 11 suitable to at least partially house the second component 20, and a second portion 12, also hollow, in which the first and the second means for sensing magnetic fields 2 and 3, and the electronic circuit 30 associated therewith, are housed; the two hollow portions 11 and 12 extend on opposite sides to each other with respect to a solid dividing wall 13 which forms the bottom wall of both hollow portions.

Preferably, the second hollow portion 12 is threaded on at least part of the external surface 14 thereof, to allow screwing into a corresponding seat 102 provided on the outside of the enclosure 101 of the transmitter 100.

In turn, the second component 20 comprises a substantially solid body in the shape of a push button having a lower portion 21, i.e. substantially cylindrical in shape, suitable to be inserted inside the first hollow portion 11, and in which there is produced at least one seat 22 to house the magnetic actuating means, and an upper or top portion 23 which projects from the first hollow portion 11 to be actuated by an operator.

The magnetic actuation means preferably comprise an activation magnet 4 and a protective shield 5, produced, for example, with a plate made of ferromagnetic material, which are housed in two respective seats 22 produced in the lower portion 21 of the second component 20, for example, by forcing them into said seats 22 so that they are substantially integral with said second component 20.

In turn, the first and second means for sensing magnetic fields comprise, respectively, a first magnetic switch 2 and a second magnetic switch 3, constituted, for example, by reed relays, which are positioned on a supporting element or board 7, on which an electronic circuit 30 operatively connected thereto is also disposed; this supporting element 7, with the components disposed thereon, is housed in the second hollow portion 12 with the ends inserted in corresponding grooves produced in the inner walls of said second portion 12.

Figure 2:
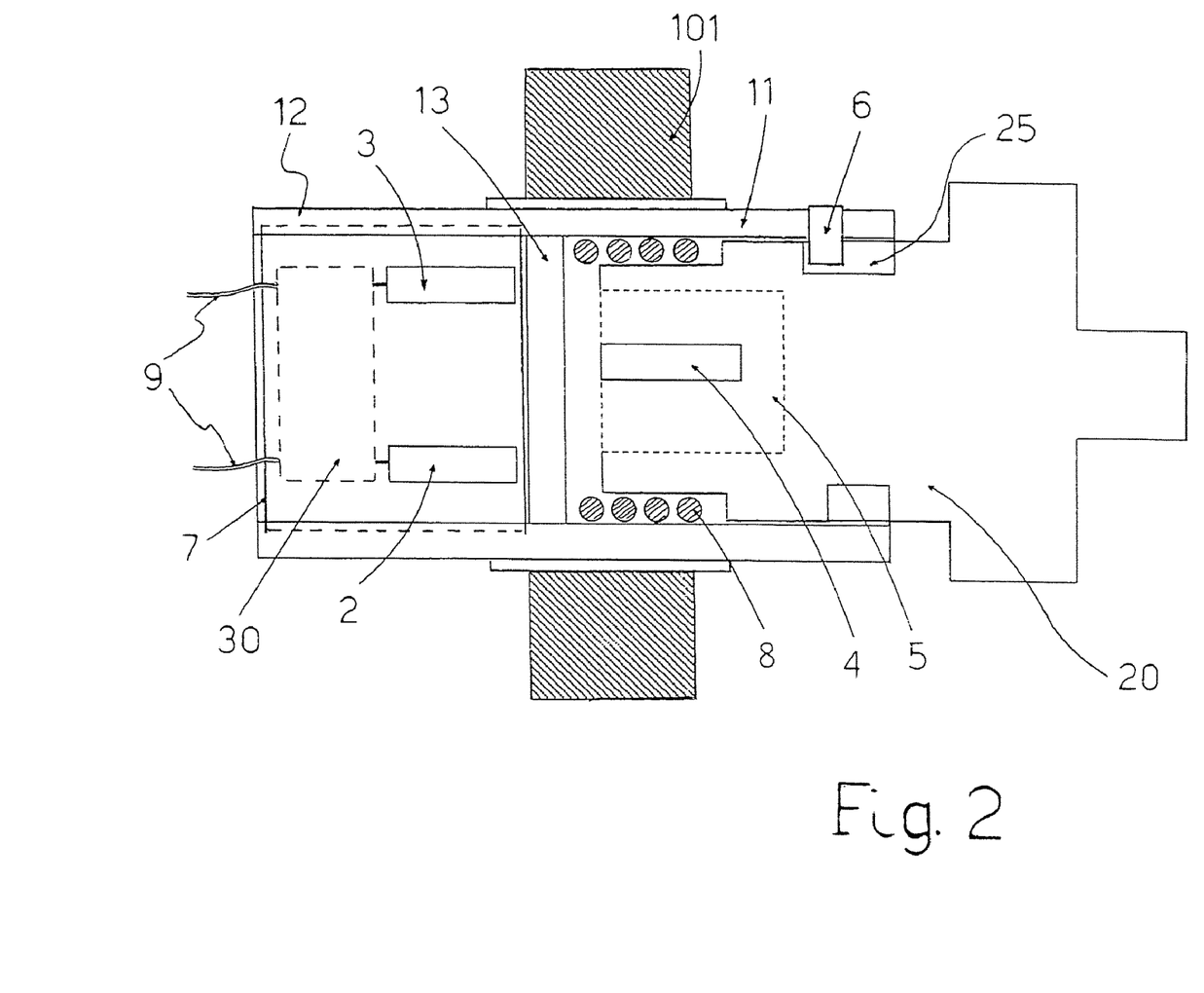
FIG. 2 is a sectional view schematically illustrating the device in FIG. 1 in a non-activating position.
Figure 3:
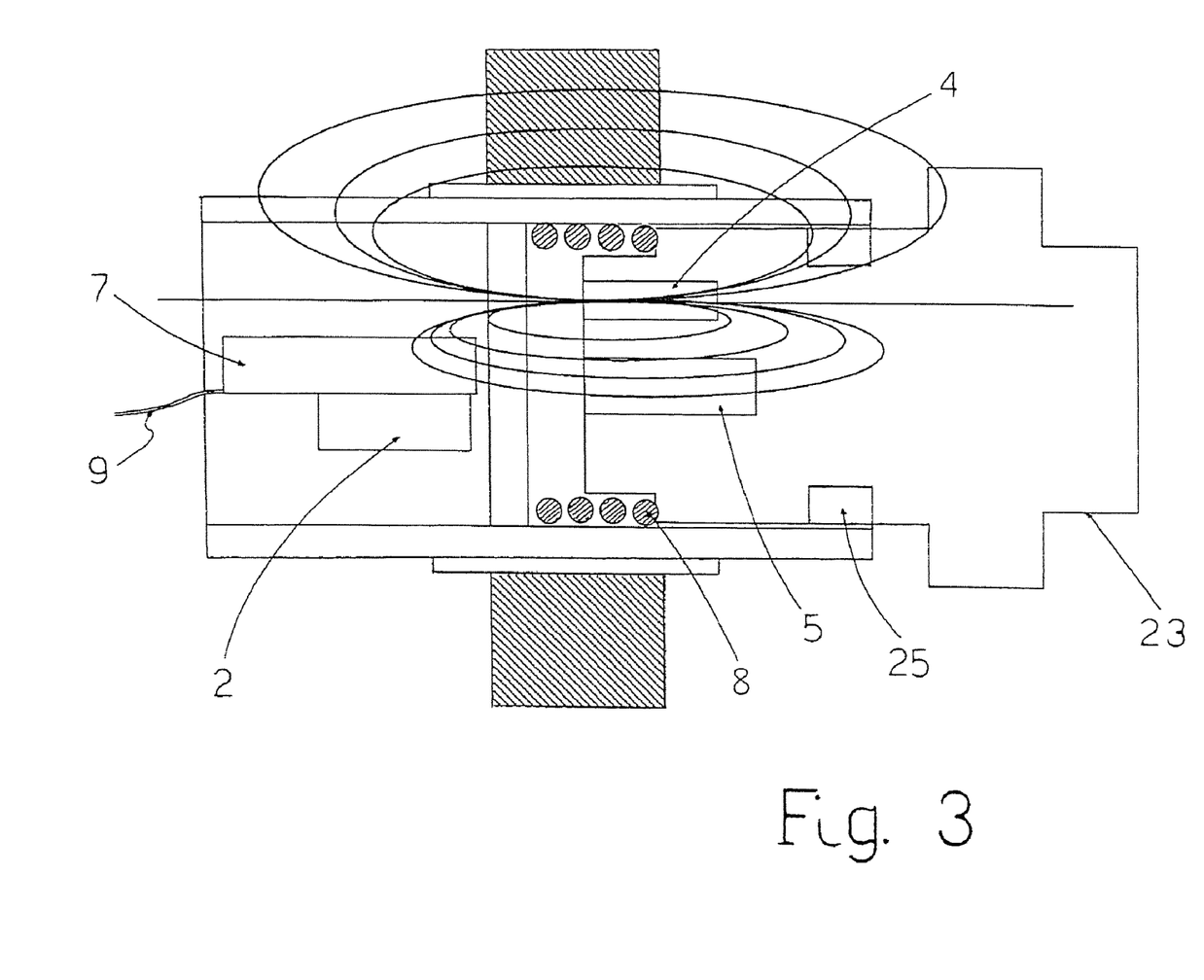
FIG. 3 is the section of FIG. 2 rotated through 90° illustrating the trend of the magnetic field in a non-activating position.

In a preferred embodiment of the device according to the invention, the two components 10 and 20 are mechanically coupled to each other through means for operatively connecting and guiding the second component 20 in relation to the first component 10; in particular, these connecting and guiding means comprise a stopper pin 6 which, as illustrated in FIG. 2, passes through a through hole 15 disposed in the wall of the first hollow portion 11, and is inserted in a branched channel or race 25 produced in the lower portion 21 of the second component 20.

Moreover, the means for operatively connecting and guiding comprise an elastic element 8, such as a spring, which is disposed housed inside the first hollow portion 11 so as to encircle the lower portion 21 and act in contrast with the upper portion 23 of the second component 20.

During use, the device with the various elements assembled is operatively connected to a transmitter by operatively connecting the electronic circuit 30 to the electronics of said transmitter; in particular, this operation can be performed simply by connecting two wires, indicated schematically in the figures by the reference number 9, to the terminal block 35 of the transmitter which in turn is connected to the electronics 36 of said transmitter. The device is then connected mechanically by screwing the first component 10 into the threaded seat 102 so that the device takes the position illustrated schematically in FIG. 2. In this position, the pin 6 is inserted in the vertical section of the race 25 and the spring 8 holds the second component 20 at a suitable distance to prevent accidental activation of the two magnetic switches 2 and 3. In this neutral non-activating position the trend of the magnetic field resulting from interaction between magnet 4 and shield 5 is such that neither of the two magnetic switches 2 and 3 is activated, as illustrated schematically in FIG. 3.

Figure 4:
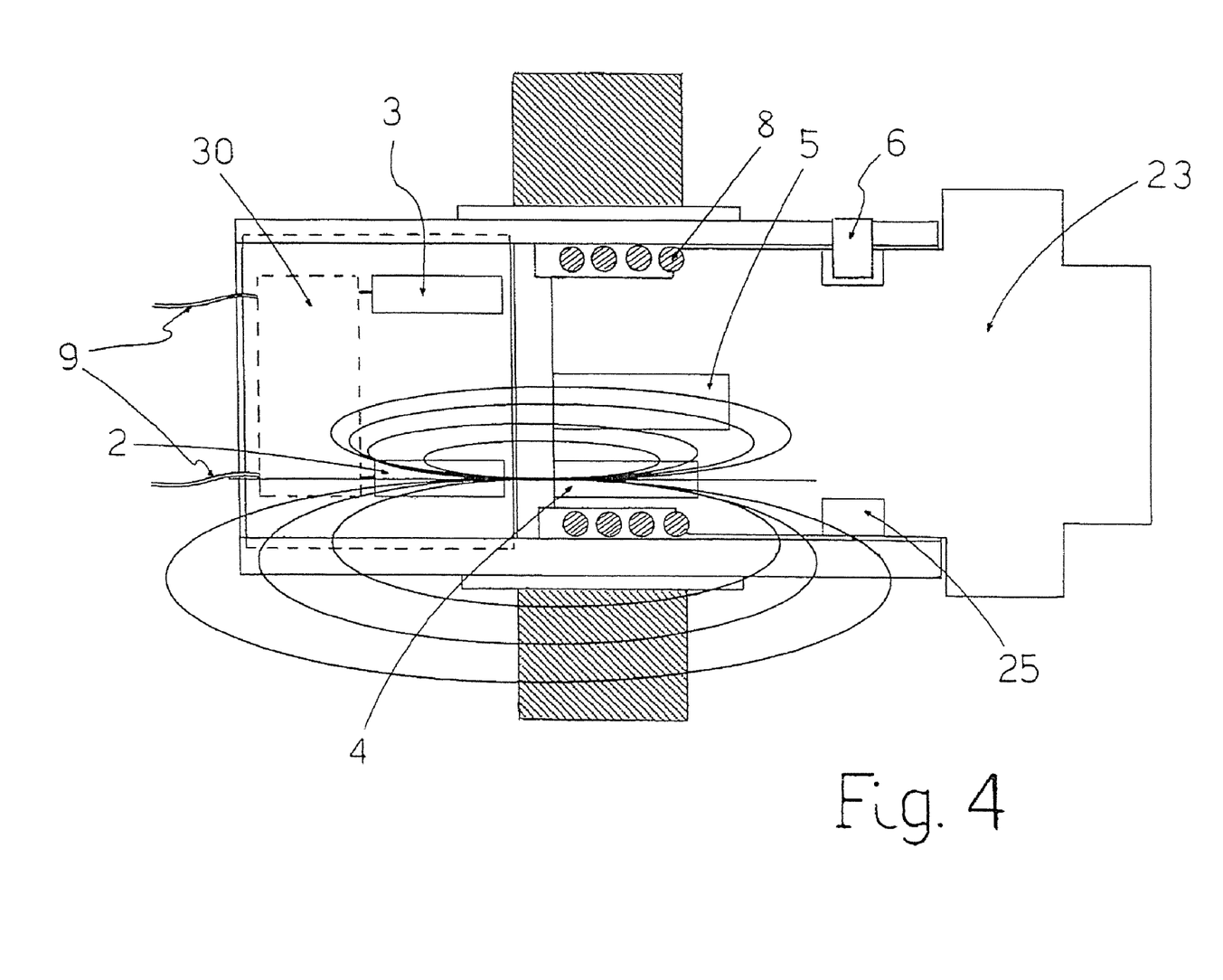
FIGS. 4 and 5 are sectional views schematically illustrating the device according to the invention in the activating position respectively of the first and of the second means for sensing magnetic fields.

When calibration is performed, starting from the position in FIG. 2, an operator acts on the top portion 23 of the second component 20 pressing it downward and rotating it, for example, counter-clockwise; by virtue of this actuation, the pin 6 slides into one of the two lateral branches of the race 25 accurately guiding the movement of the second component 20 with respect to the first component 10; in this way, as illustrated in FIG. 4, the trend of the magnetic field caused by the magnet 4 and shield 5 assembly is such to magnetically activate only one of the two magnetic switches, i.e. the magnetic switch 2.

Figure 5:
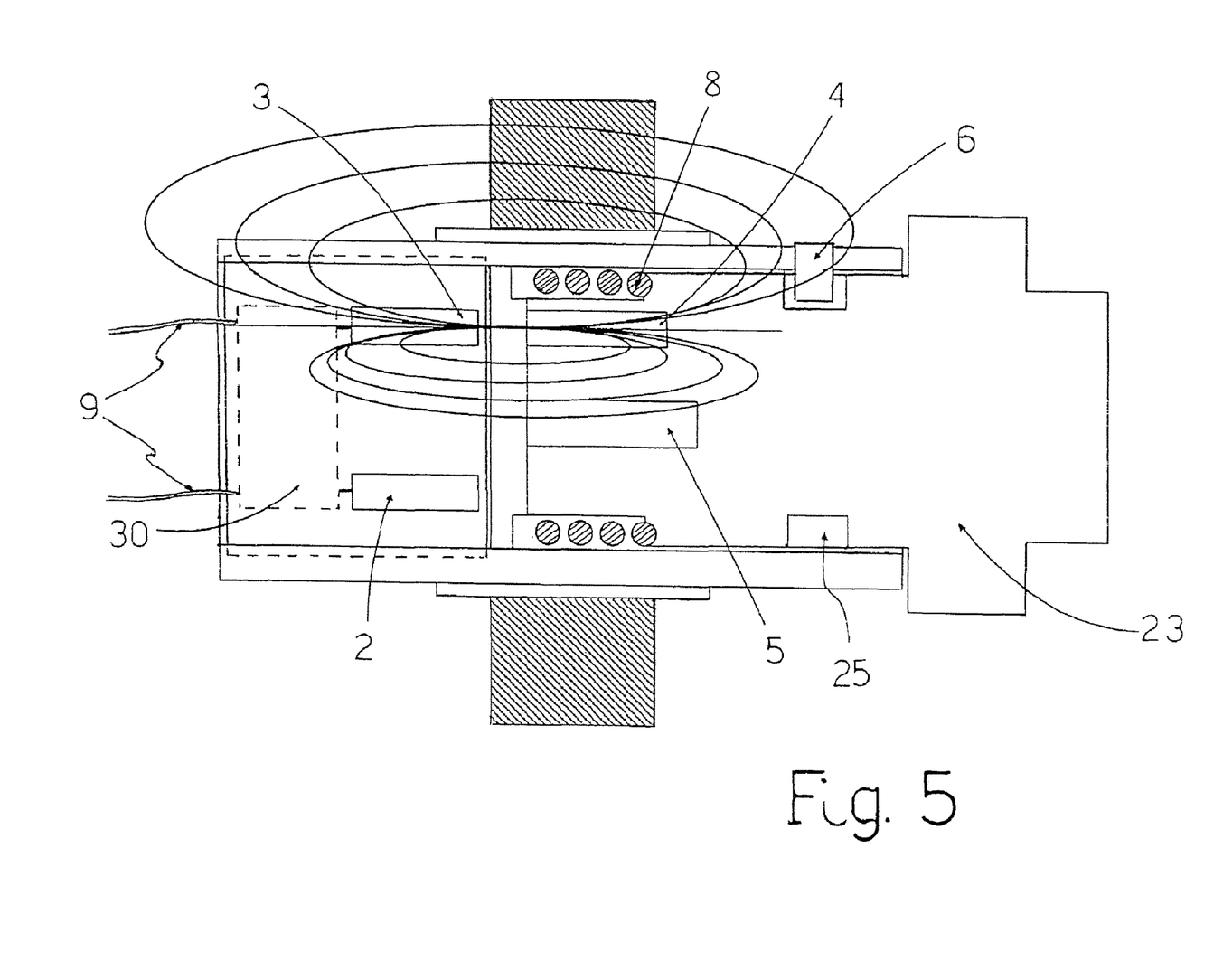

The same situation is obtained by rotating the second component 20 in the opposite direction to the previous one, with the pin 6 sliding in the other branch of the race and guiding movement so that the magnetic field determined by the magnet 4 and shield 5 assembly activates only the other magnetic switch 3, as illustrated in FIG. 5.

Activation of each magnetic switch 2 or 3, which in practice causes them to switch from an OFF state to an ON state, allows passage of a corresponding input signal towards the electronic circuit 30; this signal is suitably processed through: a microprocessor 31, i.e. a model PIC 10F206 microcontroller, which receives the input signal and emits a corresponding signal, i.e. in the form of a square wave type signal; a signal generator 32, i.e. a band pass filter, which filters the output signal from the microprocessor 31 transforming it into a sinusoidal type physical signal; and a circuit to adjust the power supply voltage 33 which is operatively connected to the terminals through the wires 9 and allows adjustment of the power supply voltage of said circuit 30 and protection against heating, overvoltages, etc.

In output, through the connection wires 9, the electronics 30 communicate to the electronics 36 of the transmitter 100 that activation of one of the two functions has taken place, i.e. through a digital communication protocol, i.e. of the HART type; consequently, the electronics of the transmitter set first one and then the other of the parameters as a function of the signal received from one or other magnetic switch 2, 3.

In this way, the two parameters are in practice calibrated in sequence; as stated, these parameters allow, for example, setting of the zero and span/full scale values of the transmitter, thereby defining the ends of the measurement/sensing range.

In practice, it has been seen how the calibration device according to the invention allows the aim and the objects set to be fully achieved, providing a series of advantages with respect to prior art. In fact, the device is produced according to a constructive structure optimized both as a whole and in the single elements, easy to install and use, and functionally efficient. In particular, the device has a functionally standalone structure, on which all the basic elements required for calibration operations are positioned directly, and which is coupled to the transmitter on the outside thereof as a sort of separate accessory, replaceable or removable at any time.

This stand-alone functionality also allows it to be used with transmitters that are not have electromagnetic components inside for calibration operations.

The entire assembly is produced in full compliance with the requirements of reliability and safety; in fact, thanks in particular to the configuration of the two components 10 and 20, there is in practice a clean separation between the external atmosphere and the internal part of the transmitter as the only interaction is the initial one to connect the connection wires 9, and calibration operations take place exclusively from the outside of the transmitter body; any flames or sparks that are generated inside cannot spread to the outside as the thread on the external surface 14 forms a sufficiently long and safe flame path.

As previously mentioned, the device according to the invention can be used with various types of field transmitters for measuring a variable of a process fluid. Therefore, a further object of the present invention is a transmitter, in particular a pressure transmitter, characterized in that it comprises a calibration device as previously described.

The device thus conceived is susceptible to numerous modifications and variants, all falling within the scope of the inventive concept; for example, the shaped body 1 could be produced with a different number of components, the shaping of the components 10 and 20 could be modified, as could the reciprocal positioning of the various elements, provided that this is compatible with the functionalities for which they have been designed and configured.

Moreover, all details can be replaced by other technically equivalent elements; in practice, the type of materials within the scope of the applications described above, arid the dimensions, can be any according to requirements and to the state of the art.

The invention claimed is:

1. A device for calibration of a field transmitter wherein it comprises a shaped body on which there are disposed first means for sensing magnetic fields the activation of which allows calibration of a first measurement parameter of the transmitter, second means for sensing magnetic fields the activation of which allows calibration of a second measurement parameter of the transmitter, magnetic actuation means suitable to activate said first and second means for sensing magnetic fields, said shaped body being configured so that it can be removably connected to the transmitter on the external surface of the enclosure thereof.

2. A device as claimed in claim 1, wherein said shaped body comprises a first component to which said first and second means for sensing magnetic activation fields are operatively associated, which is suitable to be removably connected to the enclosure of the transmitter, and a second component to which said magnetic actuation means are operatively connected, which is connected to the first component movably in relation thereto.

3. A device as claimed in claim 2, wherein said second component is coupled movably to the first component so that said magnetic actuation means are positionable in a non-activating position of said first and second means for sensing magnetic fields, or in an activating position of said first and/or second magnetic means.

4. A device as claimed in claim 3, wherein said magnetic actuation means are housed on the body of the second component and are configured so as to alternately activate either said first means for sensing magnetic fields or said second means for sensing magnetic fields.

5. A device as claimed in claim 2, wherein said second component is coupled to the first component rotatably with respect thereto.

6. A device as claimed in claim 2, wherein on said shaped body there is disposed an electronic circuit operatively connected to said first and second means for sensing magnetic fields.

7. A device as claimed in claim 6, wherein said electronic circuit communicates, through wires for connection to the transmitter, a signal which allows activation of the calibration of said first and/or second measurement parameter.

8. A device as claimed in claim 6, wherein it comprises means for operatively connecting and guiding said second component in relation to said first component.

9. A device as claimed in claim 8, wherein said first component comprises a first hollow portion suitable to at least partially receive said second component, and a second hollow portion in which said first and second means for sensing magnetic fields and said electronic circuit operatively associated therewith are housed, said first and second hollow portions being separated and extending on opposite sides to each other with respect to a solid dividing wall.

10. A device as claimed in claim 9, wherein said second hollow portion is threaded on at least part of the external surface thereof.

11. A device as claimed in claim 9, wherein said second component has a substantially solid body in the shape of a push button having a lower portion suitable to be inserted inside said first hollow portion and in which there is produced at least one seat to house said magnetic actuation means, and a top portion which projects from said first hollow portion to be actuated by an operator.

12. A device as claimed in claim 11, wherein said magnetic actuation means comprise an activation magnet and a protective shield housed in two corresponding seats of said lower portion.

13. A device as claimed in claim 11, wherein said means for operatively connecting and guiding comprise a stopper pin which passes through a through hole disposed in the wall of said first hollow portion and is inserted in a race produced in the outer surface of said lower portion.

14. A device as claimed in claim 11, wherein said means for operatively connecting and guiding comprise an elastic element housed inside said first hollow portion so as to encircle said lower portion and act in contrast with said top portion.

15. A device as claimed in claim 9, wherein said first and second means for sensing magnetic fields comprise, respectively, a first magnetic switch and a second magnetic switch positioned on a supporting element on which said electronic circuit operatively connected thereto is also disposed, said supporting element being housed in and with the ends inserted in corresponding grooves produced in the inner walls of the second hollow portion.

16. A transmitter wherein it comprises a calibration device as claimed in claim 1.

17. A device as claimed in claim 3, wherein said second component is coupled to the first component rotatably with respect thereto.

18. A device as claimed in claim 3, wherein on said shaped body there is disposed an electronic circuit operatively connected to said first and second means for sensing magnetic fields.

19. A device as claimed in claim 18, wherein said electronic circuit communicates, through wires for connection to the transmitter, a signal which allows activation of the calibration of said first and/or second measurement parameter.

20. A device as claimed in claim 5, wherein it comprises means for operatively connecting and guiding said second component in relation to said first component.

* * * * *